United States Patent [19]

Kobayashi

[11] Patent Number: 5,748,879
[45] Date of Patent: May 5, 1998

US005748879A

[54] CACHE MEMORY TESTING METHOD

[75] Inventor: Yukio Kobayashi, Kawasaki, Japan

[73] Assignee: Fujitsu Limited, Kawasaki, Japan

[21] Appl. No.: 635,399

[22] Filed: Apr. 26, 1996

[30] Foreign Application Priority Data

Jul. 4, 1995 [JP] Japan .................. 7-169049

[51] Int. Cl.⁶ .............. G06F 11/00; G06F 12/08
[52] U.S. Cl. .............. 395/183.18; 395/456; 395/468; 371/21.2
[58] Field of Search .............. 395/183.01, 183.16, 395/183.18, 185.01, 185.02, 185.06, 185.07, 427, 445, 446, 456, 468; 365/201; 371/21.1, 21.2, 51.1; 364/265.3

[56] References Cited

U.S. PATENT DOCUMENTS

| | | | |
|---|---|---|---|
| 4,686,621 | 8/1987 | Keeley et al. | 395/183.16 |
| 5,165,029 | 11/1992 | Sawai et al. | 395/403 |
| 5,274,787 | 12/1993 | Hirano et al. | 395/470 |
| 5,287,503 | 2/1994 | Narad | 395/727 |
| 5,335,327 | 8/1994 | Hisano et al. | 395/445 |
| 5,381,544 | 1/1995 | Okazawa et al. | 395/182.03 |
| 5,406,504 | 4/1995 | Denisco et al. | 395/183.18 |
| 5,502,825 | 3/1996 | Nishimukai et al. | 395/403 |
| 5,513,344 | 4/1996 | Nakamura | 395/185.18 |
| 5,537,574 | 7/1996 | Elko et al. | 395/468 |
| 5,544,345 | 8/1996 | Carpenter et al. | 395/468 |
| 5,546,579 | 8/1996 | Josten et al. | 395/183.14 |
| 5,553,262 | 9/1996 | Ishida et al. | 395/450 |
| 5,594,887 | 1/1997 | Osaka | 395/471 |
| 5,603,005 | 2/1997 | Bauman et al. | 395/451 |

*Primary Examiner*—Albert Decady
*Attorney, Agent, or Firm*—Staas & Halsey

[57] ABSTRACT

A cache memory testing method is employed to test a cache memory control mechanism which controls data coherency between cache memories or between a main storage unit and a cache memory in a system including N processors each having a cache memory and coupled to the main storage unit, where the processors are access sources and N is an integer greater than one. The cache memory testing method includes the steps of (a) dividing a control unit depending on N, and allocating access regions within the cache memories at positions which are mutually different and are peculiar to each of the N processors in the divided portions of the control unit, where the control unit is a mechanical minimum unit of the data coherency control, and (b) testing the cache memory control mechanism based on read data by writing data to and reading data from only the peculiar access regions within the same control unit by each of the N processors.

11 Claims, 17 Drawing Sheets

FIG. 5

| STATE | | STATE OF CACHE MEMORY 2 A | STATE OF CACHE MEMORY 2 B |
|---|---|---|---|
| ST 1 | WRITE BY CPU1A | A ? | INVALID |
| ST 2 | WRITE BY CPU1B | INVALID | A B |
| ST 3 | WRITE BY CPU1A | A' B | INVALID |
| ST 4 | WRITE BY CPU1B | INVALID | A' B' |
| ST 5 | READ BY CPU1A | A' B' | A' B' |
| ST 6 | WRITE BY CPU1A | A" B' | INVALID |
| ST 7 | READ BY CPU1B | A" B' | A" B' |
| ST 8 | WRITE BY CPU1B | INVALID | A" B" |

FIG. 13

P1 ⇒
RANDOM ACCESS INSTRUCTION
STRING SOURCE REGION (CREATED BY METHOD OF FIG. 10)

P2 ⇒
RANDOM TESTING ACCESS
INSTRUCTION STRING EDITING
REGION (RANDOM ACCESS INSTRUCTION
STRING WITH CHAINED DATA)

FIG. 15

P1 ⇒
RANDOM ACCESS INSTRUCTION
STRING SOURCE REGION (CREATED BY METHOD OF FIG. 10)

P2 ⇒
RANDOM TESTING ACCESS
INSTRUCTION STRING EDITING
REGION (RANDOM ACCESS INSTRUCTION
STRING WITH CHAINED DATA)

FIG. 17

P1 ⇒
```
RANDOM ACCESS INSTRUCTION
STRING SOURCE REGION (CREATED BY METHOD OF FIG. 10)
```

P2 ⇒
```
RANDOM TESTING ACCESS
INSTRUCTION STRING EDITING
REGION (RANDOM ACCESS INSTRUCTION)
  STRING WITH CHAINED DATA
```

P3 ⇒
```
RECORDING REGION OF
PROCESSED DATA
```

CACHE MEMORY TESTING METHOD

BACKGROUND OF THE INVENTION

The present invention generally relates to cache memory testing methods, and more particularly to a cache memory testing method which tests a cache memory control mechanism for controlling access to a cache memory.

In a system including a plurality of central processing units (CPUs) which are respectively coupled to a cache memory, a test is carried out by making access to the cache memory from each CPU which becomes an access source, and testing a cache memory control mechanism which controls the access to the cache memory. It is desirable that the testing of the cache memory control mechanism is carried out at a high speed, even when testing an extremely large number of transactions related to competitive timings of the access sources.

FIG. 1 is a system block diagram showing a conceivable cache testing method. A system shown in FIG. 1 includes CPUs 100A and 100B which become the access sources, cache memories 101A and 101B, and a memory 102 which has a slow access speed compared to access speeds of the cache memories 101A and 101B.

A data coherency control between the cache memories 101A and 101B and the memory 102 of this system is carried out so that only the newest datum exists within the system with respect to a region in which the newest datum is written. For example, when the datum of the same region exists in two or more cache memories, such as the cache memories 101A and 101B, a control is carried out so that only the newest datum is read with respect to all read that is made after an undefined write is carried out and the old datum prior to the write is not visible from the access source.

According to this conceivable cache testing method, it is possible to judge whether or not the old datum is replaced by the newest datum as follows. That is, the datum that is written in the region of the cache memory 101A by the CPU 100A which is one access source are read and copied to the cache memory 101B by the CPU 100B which is another access source but does not share the cache memory 101A with the CPU 100A. It is possible to judge whether or not the old datum is replaced by the newest datum by detecting whether or not the datum read by the CPU 101B is the datum written by the CPU 100A. A similar test can be made with respect to the access from an access source other than the CPU 100A, that is, the CPU 100B in this particular case.

FIG. 2 is a flow chart for explaining the operations of the CPUs 100A and 100B shown in FIG. 1. In FIG. 2, steps S101 through S105 correspond to the operation of the CPU 100A, and steps S111 through S116 correspond to the operation of the CPU 100B.

In FIG. 2, the CPU 101A writes the datum indicated by a pointer 1 from the memory 102 to a region A of the cache memory 101A in a step S101. The CPU 101A then sets a write complete flag in a step S102. The CPU 101B decides whether or not a write flag is set in a step S111, in synchronism with the step S102. When the decision result in the step S111 becomes YES, the CPU 101B reads the datum in the region A from the cache memory 101A and copies the datum to the cache memory 101B in a step S112. The CPU 101B decides whether or not the read datum is the datum indicated by the pointer 1 in a step S113. When the decision result in the step S113 is NO, the CPU 101B makes an error notification in a step S114 and the process of the CPU 101B ends. On the other hand, when the decision result in the step S113 is YES, the CPU 101B resets the write complete flag in a step S115.

The CPU 101A decides whether or not the write complete flag is reset in a step S103, in synchronism with the step S115. The CPU 101A updates the pointer 1 in a step S104 when the decision result in the step S103 becomes YES. The CPU 101A thereafter decides whether or not all the write is completed in a step S105, and the process returns to the step S101 when the decision result in the step S105 is NO. The process of the CPU 101A ends when the decision result in the step S105 is YES. On the other hand, after the step S115, the CPU 101B decides whether or not all the read is completed in a step S116, and the process returns to the step S111 when the decision result in the step S116 is NO. The process of the CPU 101B ends when the decision result in the step S116 is YES.

However, according to the conceivable cache memory testing method described above, the second access source reads the datum from the region of the cache memory written by the first access source and judges whether or not the read datum is the datum written by the first access source after the second access source recognizes that the data write with respect to the cache memory from the first access source has ended. In other words, it is necessary to carry out a synchronous control so that the data read from the cache memory by the second access source is made after the data write with respect to the cache memory from the first access source ends.

It is conceivable to carry out the above synchronous control using some kind of program logic technique. However, compared to the number of program steps required to make the write or read by the access source, the number of program steps required for the synchronous control increases by a factor of approximately several tens to approximately several hundred. For this reason, there is a problem in that the time required to carry out the synchronous control is extremely long compared to the access times of the access sources. In addition, when the time required for the synchronous control is extremely long, there is also a problem in that the test efficiency becomes extremely poor when a large number of test patterns exist and a considerably long testing time becomes necessary. Furthermore, because of the need to carry out the synchronous control, there is another problem in that simultaneous accesses or the like cannot be tested.

SUMMARY OF THE INVENTION

Accordingly, it is a general object of the present invention to provide a novel and useful cache memory testing method in which the problems described above are eliminated.

Another and more specific object of the present invention is to provide a cache memory testing method which does not require a synchronous control. According to the cache memory testing method of the present invention, the testing of a cache memory control mechanism can be carried out at a high speed, even when testing an extremely large number of transactions related to competitive timings of access sources.

Still another object of the present invention is to provide a cache memory testing method for testing a cache memory control mechanism which controls data coherency between cache memories or between a main storage unit and a cache memory in a system including N processors each having a cache memory and coupled to the main storage unit, where the processors are access sources, N is an integer greater than one, and the cache memory testing method comprises the steps of (a) dividing a control unit depending on N, and allocating access regions within the cache memories at positions which are mutually different and are peculiar to each of the N processors in the divided portions of the control unit, the control unit being a mechanical minimum unit of the data coherency control, and (b) testing the cache memory control mechanism based on read data by writing data to and reading data from only the peculiar access regions within the same control unit by each of the N processors. According to the cache memory testing method of the present invention, it is possible to carry out a test at a high speed because it is unnecessary to synchronize the processors, that is, because no synchronous control is required. In addition, the testing of a cache memory control mechanism can be carried out at a high speed, even when testing an extremely large number of transactions related to competitive timings of access sources.

Other objects and further features of the present invention will be apparent from the following detailed description when read in conjunction with the accompanying drawings.

BRIEF DESCRIPTION OF THE DRAWINGS

FIG. 5 is a diagram for explaining state transitions of cache memories of the embodiment;

FIG. 13 is a diagram for explaining the pointers;

FIG. 15 is a diagram for explaining the pointers;

FIG. 17 is a diagram for explaining the pointers.

DESCRIPTION OF THE PREFERRED EMBODIMENTS

Figure 1:
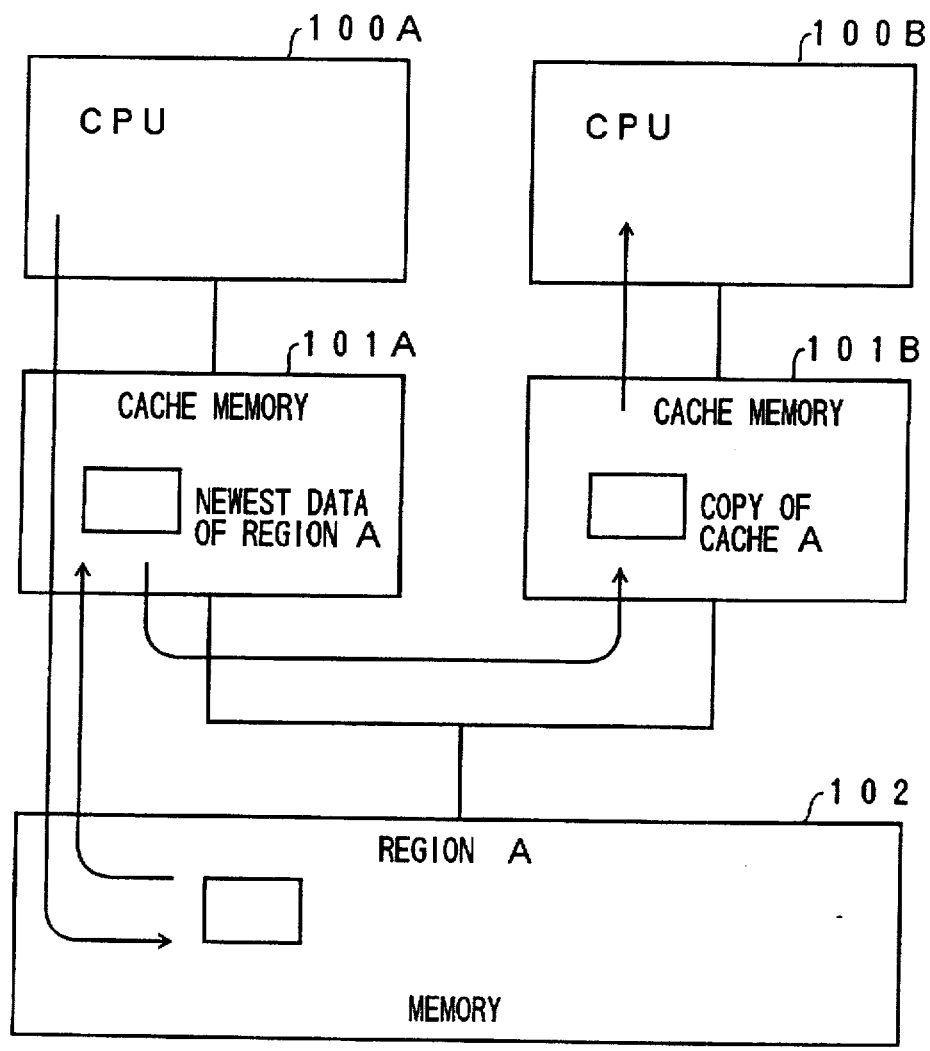
FIG. 1 is a system block diagram for explaining a conceivable cache memory testing method.
Figure 2:
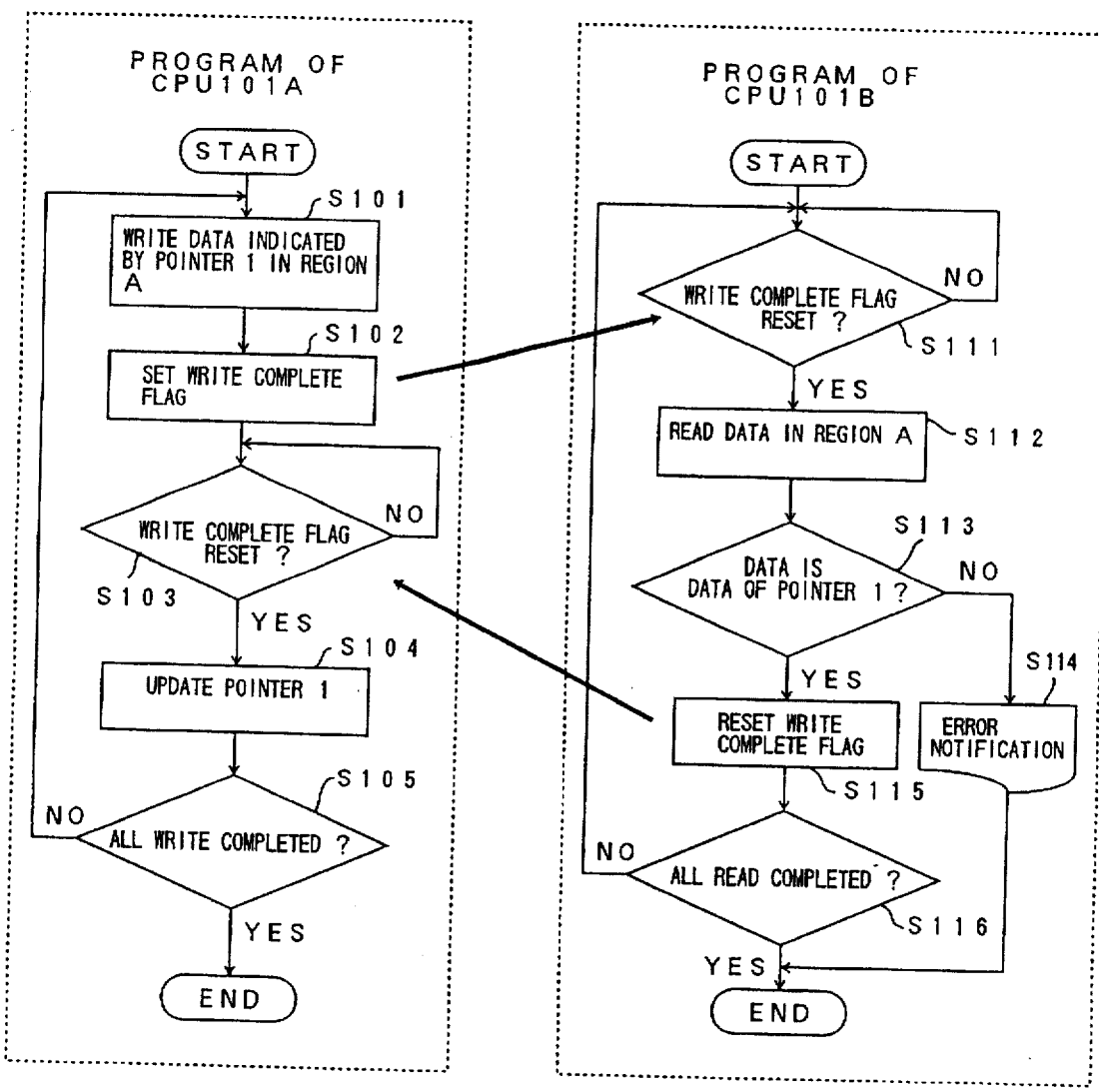
FIG. 2 is a flow chart for explaining the operations of CPUs shown in FIG. 1.
Figure 3:
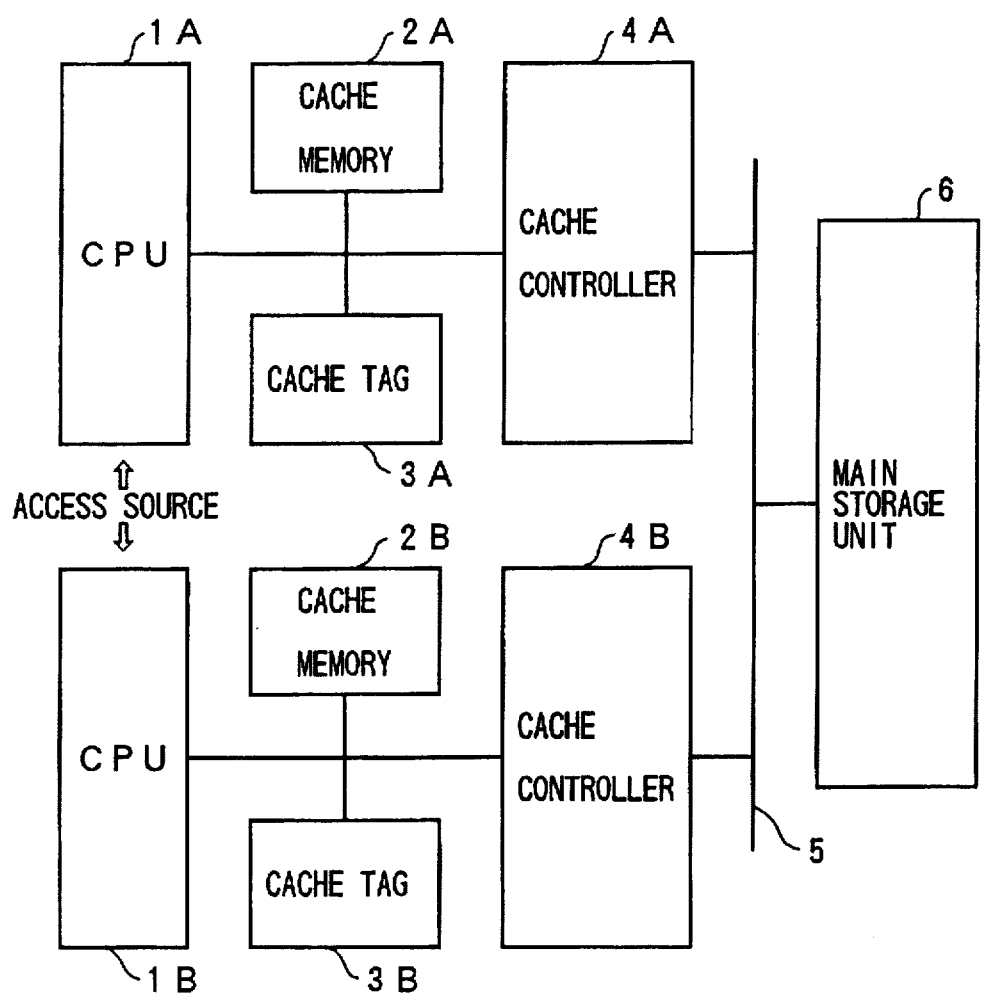
FIG. 3 is a system block diagram showing the general construction of a system to which a cache memory testing method according to the present invention is applied.

FIG. 3 is a system block diagram showing the general construction of a system to which a cache memory testing method according to the present invention is applied. The system shown in FIG. 3 includes CPUs 1A and 1B, cache memories 2A and 2B, cache tags 3A and 3B which respectively record states of the cache memories 2A and 2B, cache controllers 4A and 4B which control cache processes, a bus 5, and a main storage unit 6 which are coupled as shown. A cache memory control mechanism is formed by the CPUs 1A and 1B, the cache tags 3A and 3B, and the cache controllers 4A and 4B.

Figure 4:
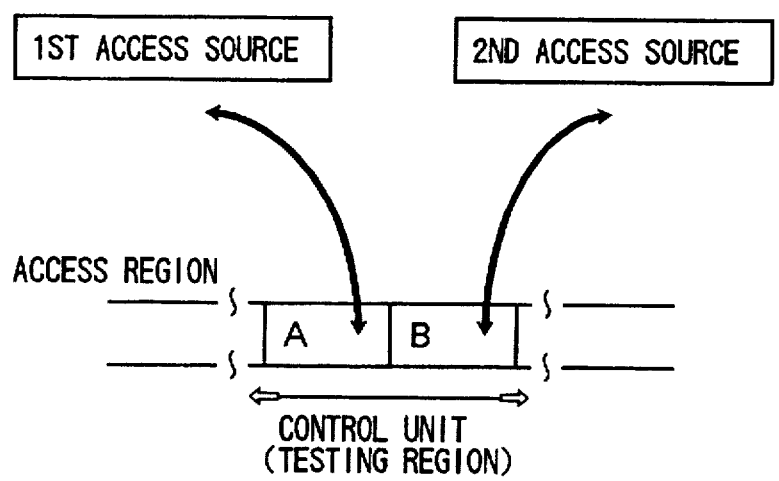
FIG. 4 is a diagram for explaining access allocation in an embodiment of the cache memory testing method according to the present invention.
Figure 6:
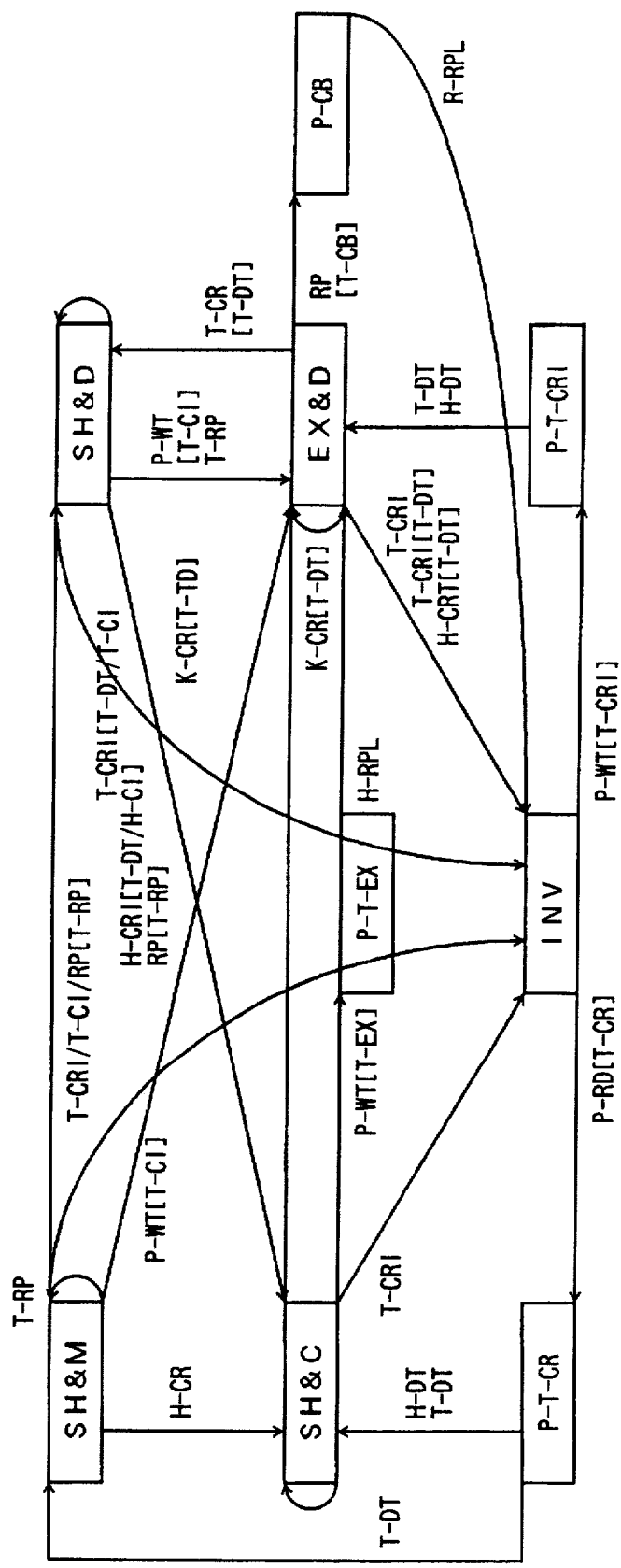
FIG. 6 is a diagram for explaining state transitions of cache tags and transactions of the embodiment.

First, a description will be given of an embodiment of the cache memory testing method according to the present invention, by referring to FIGS. 4 through 6. FIG. 4 is a diagram for explaining access allocation in this embodiment. FIG. 5 is a diagram for explaining state transitions of the cache memories of this embodiment. In addition, FIG. 6 is a diagram for explaining state transitions of the cache tags and transactions of this embodiment. In the following description, it will be assumed for the sake of convenience that the first access source is the CPU 1A and the second access source is the CPU 1B.

When carrying out a cache process by reading data from the main storage unit 6 shown in FIG. 3 and writing the read data in the cache memory 2A, for example, a minimum unit of the cache process is normally 8 bits, that is, 1 byte. However, when the continuity of the programs and data are taken into consideration, the repetition frequency of the cache process can be reduced and the efficiency of the cache process can be improved by carrying out the cache process in units of a predetermined number of bytes rather than carrying out the cache process in 1-byte units. Hence, in many cases, the cache process is carried out in control units, such as 8-byte units and 64-byte units. The present invention positively and effectively utilizes such control units.

In other words, in this embodiment, peculiar access regions are allocated for the first access source and the second access source, by dividing the control unit, which is a mechanical minimum unit used for a data coherency control between the cache memories or between the cache memory and the main storage unit. For this reason, the datum of the first access source and the datum of the second access source respectively coexist at different positions within the same control unit as shown in FIG. 4. In FIG. 4, the control unit is 64 bytes, for example, and an access region of 32 bytes or less is allocated to each of the datum of the first access source and the datum of the second access source.

When N access sources exist, for example, an access region of M/N bytes is allocated to each of the data of the N access sources, where M denotes the number of bytes of the control unit.

FIG. 5 is a diagram showing transition states ST1 through ST8 of the cache memories 2A and 2B. The CPU 1A writes a datum A in an access region which is peculiar to the CPU 1A and is within the cache memory 2A, as a newest datum of the control unit. In this state ST1, the datum which coexists within the cache memory 2B within the same control unit is invalidated. Next, in a state ST2, the CPU 1B writes a datum B in an access region which is peculiar to the CPU 1B, and in this case, the datum B is written as a newest datum reflecting the datum A that also coexists within the same control unit. In addition, in this state ST2, the datum amounting to the control unit of the datum A within the cache memory 2A becomes older than the datum within the cache memory 2B due to the write to the same control unit from the CPU 1B, and thus, the datum amounting to the control unit within the cache memory 2A is invalidated. Accordingly, at this point in time, the newest datum written by the CPU 1A and the CPU 1B exists only within the cache memory 2B.

Next, in a state ST3, when a write is newly made to write a datum A' from the CPU 1A, the cache processes are controlled so that the newest data A' and B written by the accesses from both the CPUs 1A and 1B exist only within the cache memory 2A. In this state ST3, the datum amounting to the control unit of the data A and B within the cache memory 2B becomes older than the datum within the cache memory 2A due to the write to the same control unit from the CPU 1A, and the datum amounting to the control unit within the cache memory 2B is invalidated. In addition, in a state ST4, when a write is newly made to write a datum B' from the CPU 1B, the cache processes are controlled so that the newest data A' and B' written by the accesses from both the CPUs 1A and 1B exist only within the cache memory 2B. In this state ST4, the datum amounting to the control unit of the data A' and B within the cache memory 2A becomes older than the datum within the cache memory 2B due to the write to the same control unit from the CPU 1B, and the datum amounting to the control unit within the cache memory 2A is invalidated.

On the other hand, the read from the cache memories 2A and 2B are carried out by the CPUs 1A and 1B as follows. In a state ST5, the CPU 1A attempts to read the datum A' amounting to the control unit from the cache memory 2A, but the datum amounting to the control unit within the cache memory 2A is invalidated and the datum A' is in the cache memory 2B. Hence, the datum A' is read from the cache memory 2B together with the datum B'. In a state ST6, the datum A' amounting to the control unit read from the cache memory 2B by the CPU 1A is written in the cache memory 2A as a datum A" together with the datum B'. In this state ST6, the datum amounting to the control unit of the data A" and B' within the cache memory 2B becomes older than the datum within the cache memory 2A due to the write to the same control unit from the CPU 1A, and the datum amounting to the control unit within the cache memory 2B is invalidated.

Similarly, in a state ST7, the CPU 1B attempts to read the datum B' amounting to the control unit from the cache memory 2B, but the datum amounting to the control unit within the cache memory 2B is invalidated and the datum B' is in the cache memory 2A. Hence, the datum B' is read from the cache memory 2A together with the datum A". In a state ST8, the datum B' amounting to the control unit read from the cache memory 2A by the CPU 1B is written in the cache memory 2B as a datum B" together with the datum A". In this state ST8, the datum amounting to the control unit of the data A" and B" within the cache memory 2A becomes older than the datum within the cache memory 2B due to the write to the same control unit from the CPU 1B, and the datum amounting to the control unit within the cache memory 2A is invalidated.

Therefore, when viewed from the access source, the cache process is controlled by regarding the control unit as one data, regardless of the access data length. For this reason, it is possible to carry out the cache process by regarding the entire control unit as one data. When such a control of the cache process is being carried out, a process of reading and confirming by one access source the datum which was written by the same one access source is equivalent to partially confirming the datum within the control unit. As a result, all data can be confirmed by making the partial confirmation of the data from all of the access sources.

In addition, when controlling the cache process in the above described manner, it is unnecessary to synchronize the access sources, and access patterns can be tested successively. For this reason, compared to the conceivable cache memory testing method described above, it is possible to reduce the testing time by a factor ranging from approximately 1/20 to approximately 1/500, although dependent on the number of bytes of the control unit and the number of access sources used. Furthermore, it is possible to test simultaneous accesses or the like because no synchronous control is necessary.

FIG. 6 is a diagram for explaining the state transitions and transactions of the cache tags 3A and 3B in this embodiment.

In FIG. 6, all tags are invalidated (INV) in an initial state. In addition, in the state ST1 shown in FIG. 5, only the tag related to the CPU 1A becomes "single newest (EX&D)" and is recorded in the cache tag 3A. In the state ST2, the tag related to the CPU 1B becomes "single newest (EX&D)" due to the control of the cache process and is recorded in the cache tag 3B, while the tag related to the CPU 1A changes to "invalid (INV)" and is recorded in the cache tag A. In addition, in the state ST3, the tag related to the CPU 1A becomes "single newest (EX&D)" and is recorded in the cache tag 3A, while the tag related to the CPU 1B changes to "invalid (INV)" and is recorded in the cache tag 3B. In the state ST4, the tag related to the CPU 1B becomes "single newest (EX&D)" due to the control of the cache process and is recorded in the cache tag 3B, while the tag related to the CPU 1A changes to "invalid (INV)" and is recorded in the cache tag 3A. Moreover, in the state ST5, the tag related to the CPU 1A becomes "shared copy (SH&M)" and is recorded in the cache tag 3A.

In FIG. 6, "shared copy (SH&M)" indicates a state where a read is made from the main storage unit 6 and the contents of the main storage unit 6 and the cache memory 2A or 2B match. The various transactions are illustrated in FIG. 6 using the following designations, where the inside of the brackets "[ ]" indicate a transaction (T)-bus output.

Figure 7:
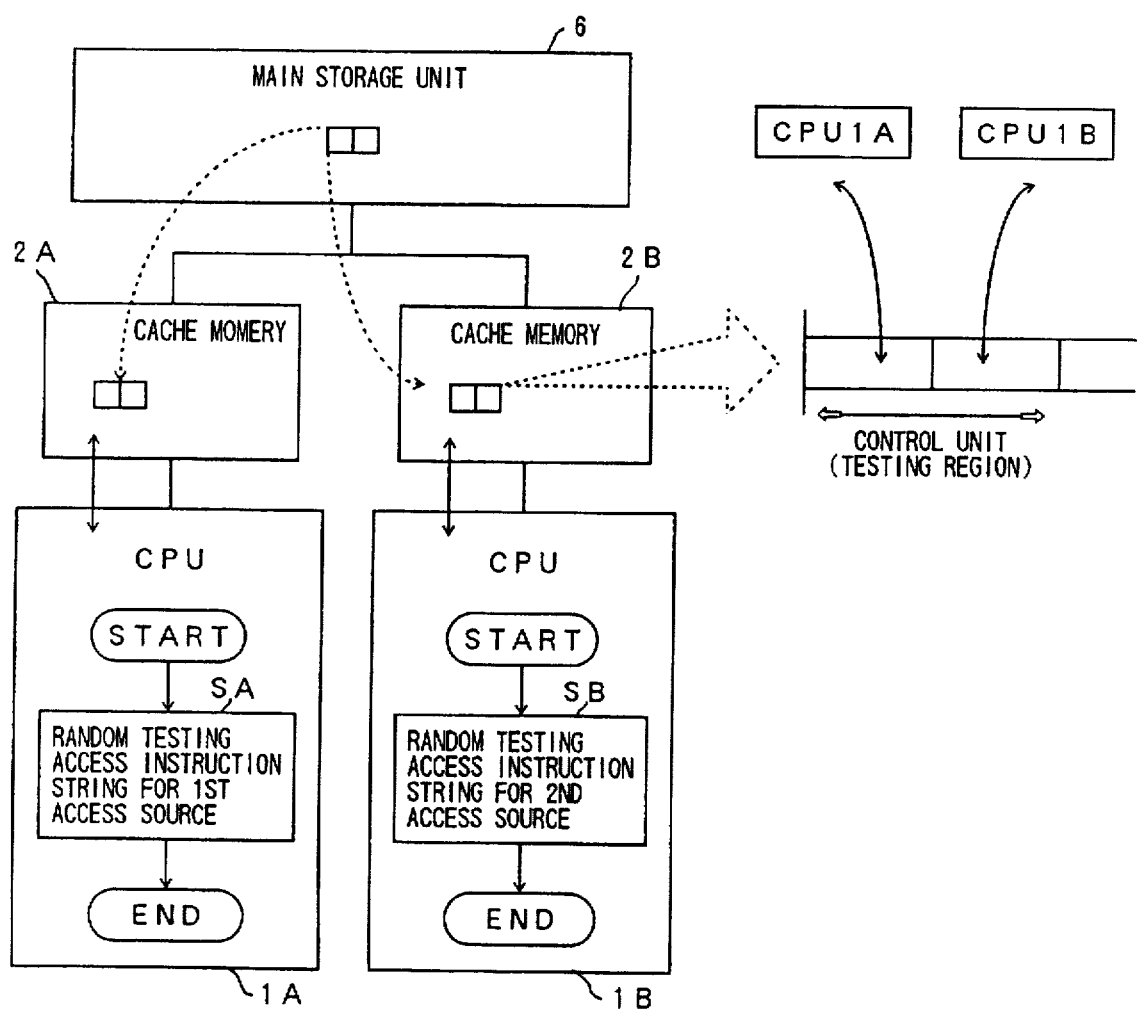
FIG. 7 is a diagram schematically showing a cache process of the embodiment.
Figure 8:
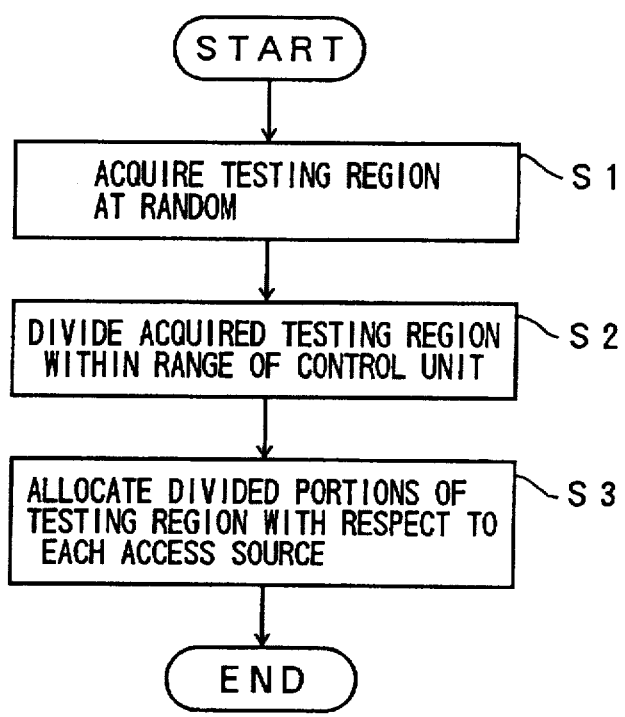
FIG. 8 is a flow chart for explaining a process of a scheduler in the embodiment.
Figure 9:
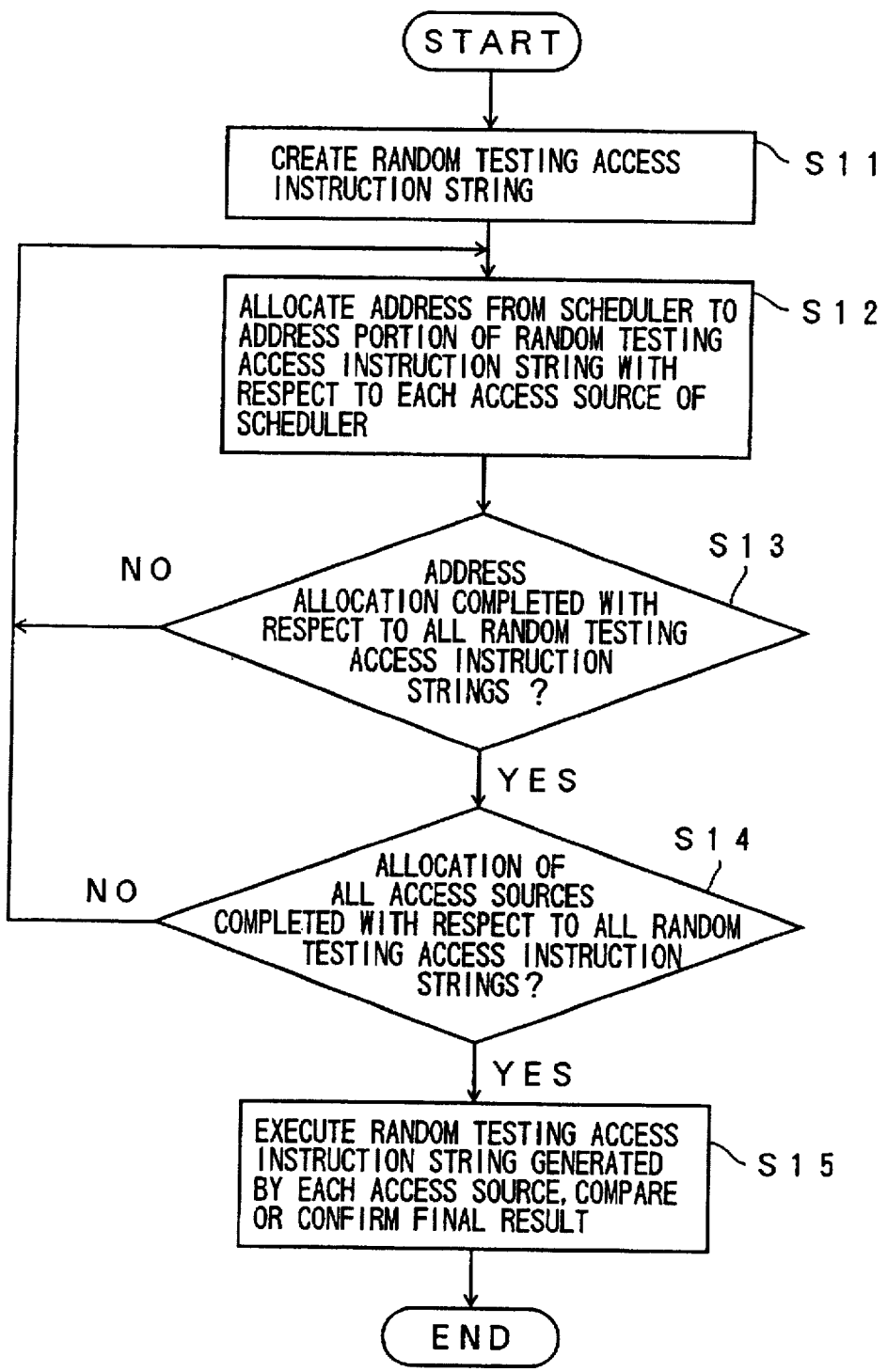
FIG. 9 is a flow chart for explaining a process of generating a test instruction string in the embodiment.

P-RD: Processor Read
P-WT: Processor Write
RP: Replace
T-CT: T-Bus Coherent Read
T-CRI: T-Bus Coherent Read & Invalidate
T-CI: T-Bus Coherent Invalidate
T-EX: T-Bus Exclusive
T-RPL: T-Bus Reply
T-DT: T-Bus Data Transfer
T-CB: T-Bus Copy Back
T-RP: T-Bus Replace
T-R: T-Bus Read
T-W: T-Bus Write
H-CR: HDC Coherent Read
H-CRI: HDC Coherent Read & Invalidate
H-CI: HDC Coherent Invalidate
H-LD: HDC Data Load
H-RPL: HDC Reply
D-DT: HDC Data Transfer
H-R: HDC Read
H-W: HDC Write FIGS. 7 through 9 are diagrams for explaining the operation of this embodiment. FIG. 7 is a diagram schematically showing the cache process of this embodiment. FIG. 8 is a flow chart for explaining a process of a scheduler in this embodiment. In addition, FIG. 9 is a flow chart for explaining a process of generating a test instruction string in this embodiment.

In FIG. 7, those parts which are the same as those corresponding parts in FIG. 3 are designated by the same reference numerals, and a description thereof will be omitted. In FIG. 7, the data transfer between the main storage unit 6 and the cache memories 2A and 2B and the data transfer between the cache memories 2A and 2B are respectively made in the control units described above, as shown on the right side of FIG. 7. The CPUs 1A and 1B respectively make access to peculiar and different positions allocated with respect to the CPUs 1A and 1B within the control unit of the same region. In a step SA, the CPU 1A generates a random access instruction string for testing the CPU 1A by carrying out a process which will be described later in conjunction with FIG. 9. Similarly, in a step SB, the CPU 1B generates a random access instruction string for testing the CPU 1B by carrying out the process which will be described later in conjunction with FIG. 9. In other words, an access region amounting to the control unit and peculiar to the access source is allocated with respect to each of the access sources.

The process of the scheduler shown in FIG. 8 carries out scheduling of the access regions of the CPUs 1A and 1B, that is, each of the access sources. This scheduler is formed by a host unit (not shown) which is provided with respect to the CPUs 1A and 1B or, one of the CPUs 1A and 1B that is used as a master CPU. In FIG. 8, a step S1 acquires a testing region at random. A step S2 divides the acquired testing region within the range of the control unit. A step S3 allocates the divided portions of the testing region with respect to each of the access sources.

The test instruction string which is executed by each access source is generated as shown in FIG. 9. In FIG. 9, a step S11 creates an access instruction string for testing at random (hereinafter simply referred to as a random testing access instruction string. A step S12 allocates an address from the scheduler to an address portion of the random testing access instruction string, with respect to each access source of the scheduler. A step S13 decides whether or not the address allocation is completed with respect to all of the random testing access instruction strings, and the process returns to the step S12 when the decision result in the step S13 is NO. On the other hand, when the decision result in the step S13 is YES, a step S14 decides whether or not the allocation of all of the access sources is completed with respect to all of the random testing access instruction strings. The process returns to the step S12 when the decision result in the step S14 is NO. When the decision result in the step S14 is YES, a step S15 executes the random testing access instruction string that is generated by each access source, and the test is carried out by comparing or confirming the final result. In other words, when no abnormality exists in the cache memory control mechanism, all of the final results should match, and the abnormality can be detected when not all final results match.

The data coherency control between the cache memories or between the main storage unit and the cache memory is an important factor when testing the control because the timings of the access sources are various. According to this embodiment, it is possible to test the data coherency control between the cache memories or between the main storage unit and the cache memory, without synchronizing the access sources. For this reason, the type of instructions executed in each of the access sources and the execution timings of each of the access sources can be set freely in this embodiment.

In addition, as one method of creating the various timings, it is possible to generate unpredictable timings by making each of the access sources execute access instructions in a random sequence. In this case, the final results can be confirmed by making each access source execute the same random testing access instruction string and making each access region a region that is within the range of the control unit and peculiar to each access source. In this case, the execution results become the same if no abnormality exists in the cache memory control mechanism. In other words, it is possible to confirm the data coherency control between the cache memories or between the main storage unit and the cache memory, by comparing the execution results of the random testing access instruction strings of each of the access sources.

Next, a description will be given of various embodiments of a method of creating the random testing access instruction string in the step S11 shown in FIG. 9, by referring to FIGS. 10 through 17.

Figure 10:
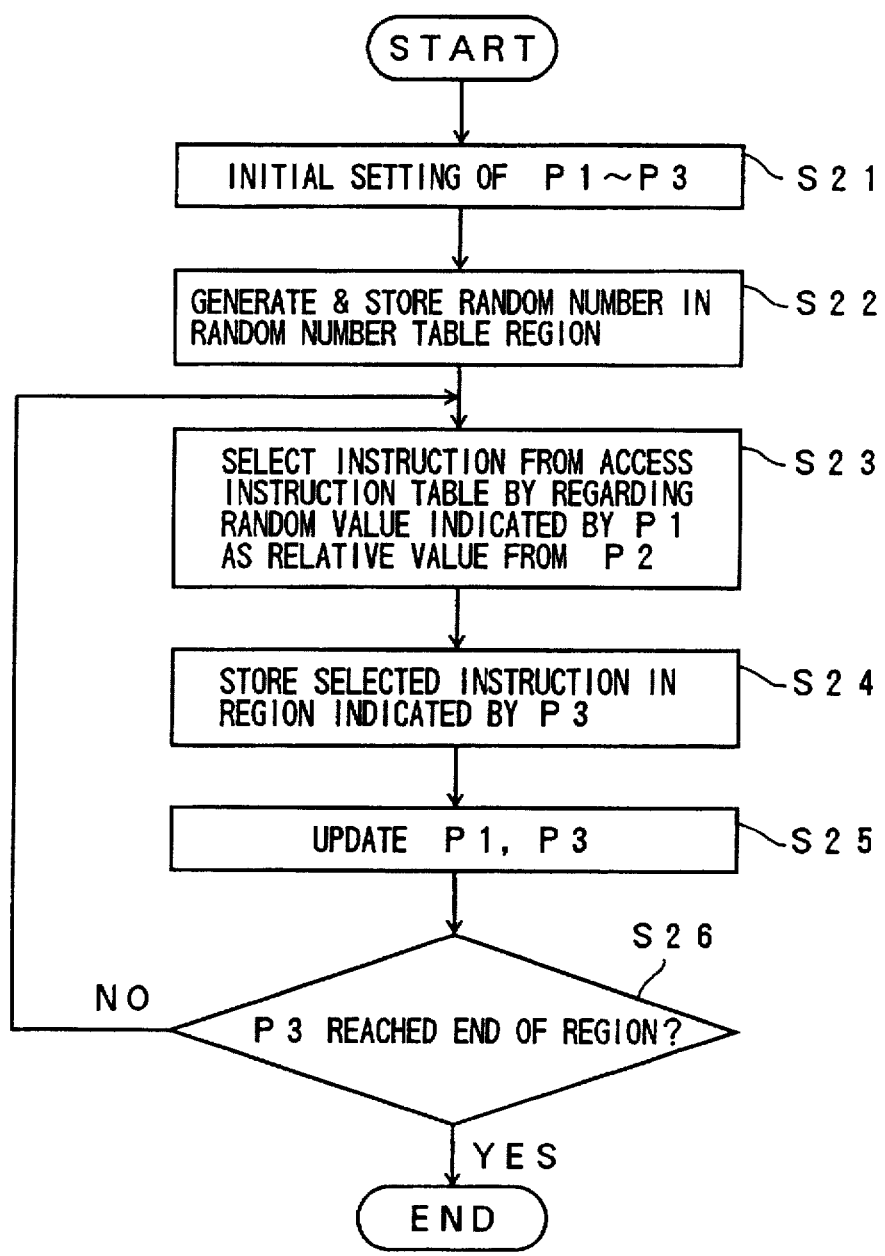
FIG. 10 is a flow chart for explaining a first embodiment of a method of creating a random access instruction string for testing.
Figure 11:
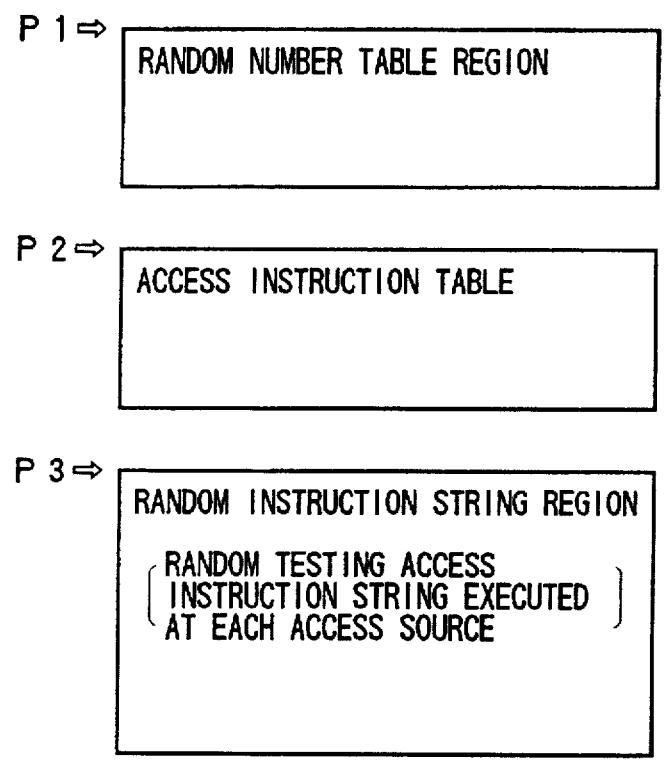
FIG. 11 is a diagram for explaining pointers.

FIG. 10 is a flow chart for explaining a first embodiment of the method of creating the random testing access instruction string, and FIG. 11 is a diagram for explaining pointers.

In FIG. 10, a step S21 carries out an initial setting with respect to pointers P1 through P3 shown in FIG. 11. A step S22 generates a random number and stores the random number in a random number table region of the cache memory which belongs to the CPU. A step S23 selects an instruction from an access instruction table by regarding the random value indicated by the pointer P1 within the cache memory as a relative value from the pointer P2. A step S24 stores the selected instruction in a region of the cache memory indicated by the pointer P3. A step S25 updates the pointers P1 and P3. A step S26 decides whether or not the pointer P3 reached an end of the access instruction string region, and the process returns to the step S23 when the decision result in the step S26 is NO. On the other hand, the process ends when the decision result in the step S26 is YES.

Therefore, this first embodiment of the method of creating the random testing access instruction string employs a logic such that a plurality of instruction strings having random arrangements are generated as access instructions used by the access sources, so that it is possible to create a competitive state caused by the various timings of other access sources. Hence, it is possible to improve the testing accuracy of the competitive state and the like.

Figure 12:
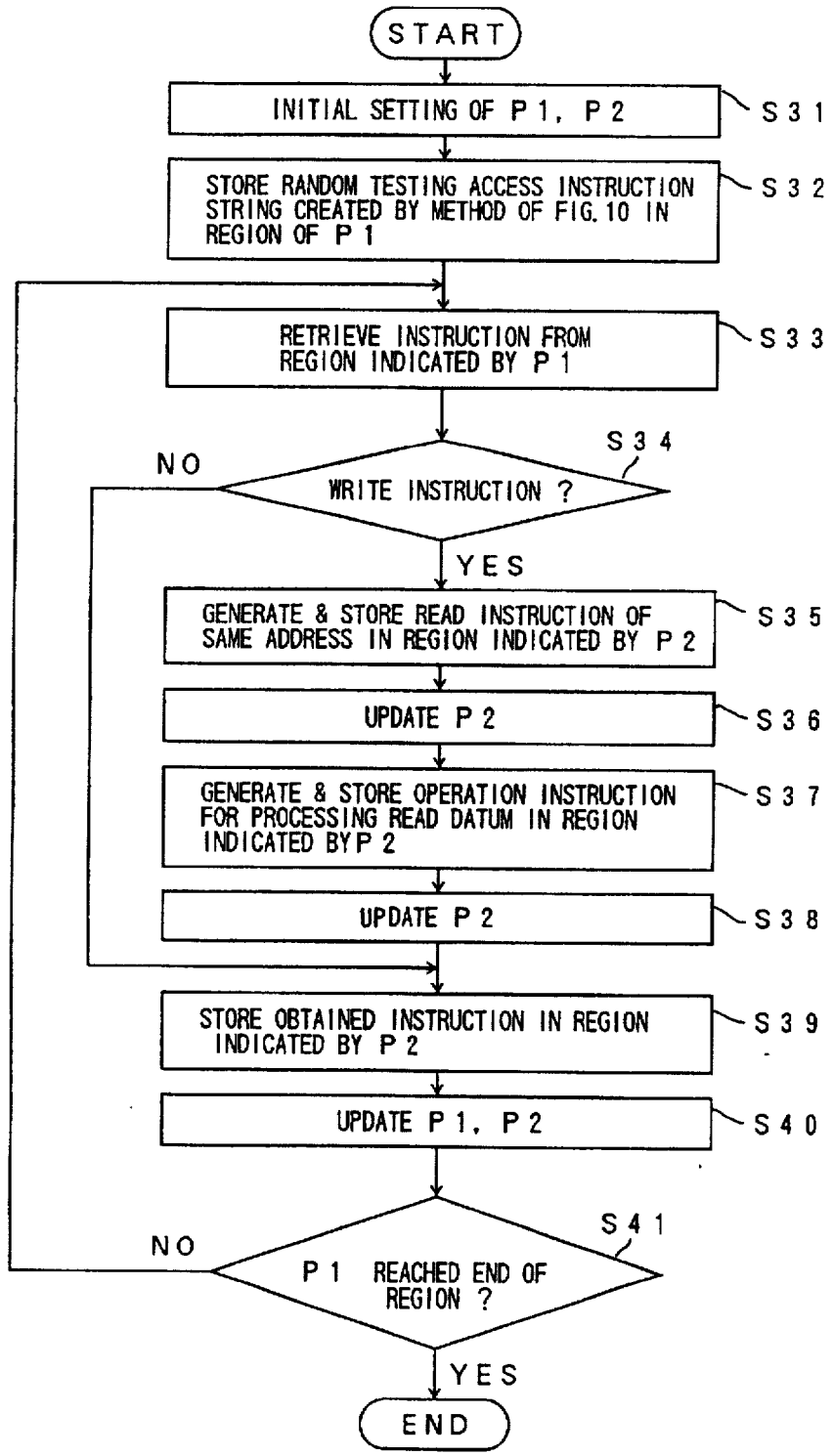
FIG. 12 is a flow chart for explaining a second embodiment of the method of creating the random access instruction string for testing.

FIG. 12 is a flow chart for explaining a second embodiment of the method of creating the random testing access instruction string, and FIG. 13 is a diagram for explaining the pointers.

In FIG. 12, a step S31 carries out an initial setting with respect to the pointers P1 and P2 shown in FIG. 13. A step S32 stores the random testing access instruction string which is created by the method described above in conjunction with FIG. 10 in a region indicated by the pointer P1. A step S33 retrieves an instruction from the region of the cache memory indicated by the pointer P1. A step S34 decides whether or not the retrieved instruction is a write instruction. The process advances to a step S39 which will be described later when the decision result in the step S34 is NO, and the process advances to a step S35 when the decision result in the step S34 is YES.

The step S35 generates a read instruction of the same address as the above write address, and stores the read instruction in a region of the cache memory indicated by the pointer P2. A step S36 updates the pointer P2. A step S37 generates an operation instruction for processing the read datum, and stores the operation instruction in the region of the cache memory indicated by the pointer P2. A step S38 updates the pointer P2. The step S39 stores the obtained instruction in the region of the cache memory indicated by the pointer P2. A step S40 updates the pointers P1 and P2, and a step S41 decides whether or not the pointer P1 reached the end of the region in which the random testing access instruction string is stored. The process returns to the step S33 when the decision result in the step S41 is NO, and the process ends when the decision result in the step S41 is YES.

Therefore, this second embodiment of the method of creating the random testing access instruction string employs a logic such that, when generating the testing access instruction string having the random sequence, a preceding write datum is read and this write datum is processed by the operation instruction or the like before adding the write instruction again. In other words, a plurality of access instructions having random arrangements are generated, and the instructions are generated so that a data chain occurs with respect to the relationship of the write and read instructions. In other words, the data are chained by the testing access instruction string. As a result, when an abnormality occurs in the result of the preceding access, the subsequent results all become different, thereby making it possible to detect the abnormality since the final result obtained by one access source becomes different from the final results obtained at another access source which executes the same instruction string. Accordingly, it is possible to improve the testing accuracy in a case where the abnormality occurs in the data of the cache memory during execution of the instruction.

Figure 14:
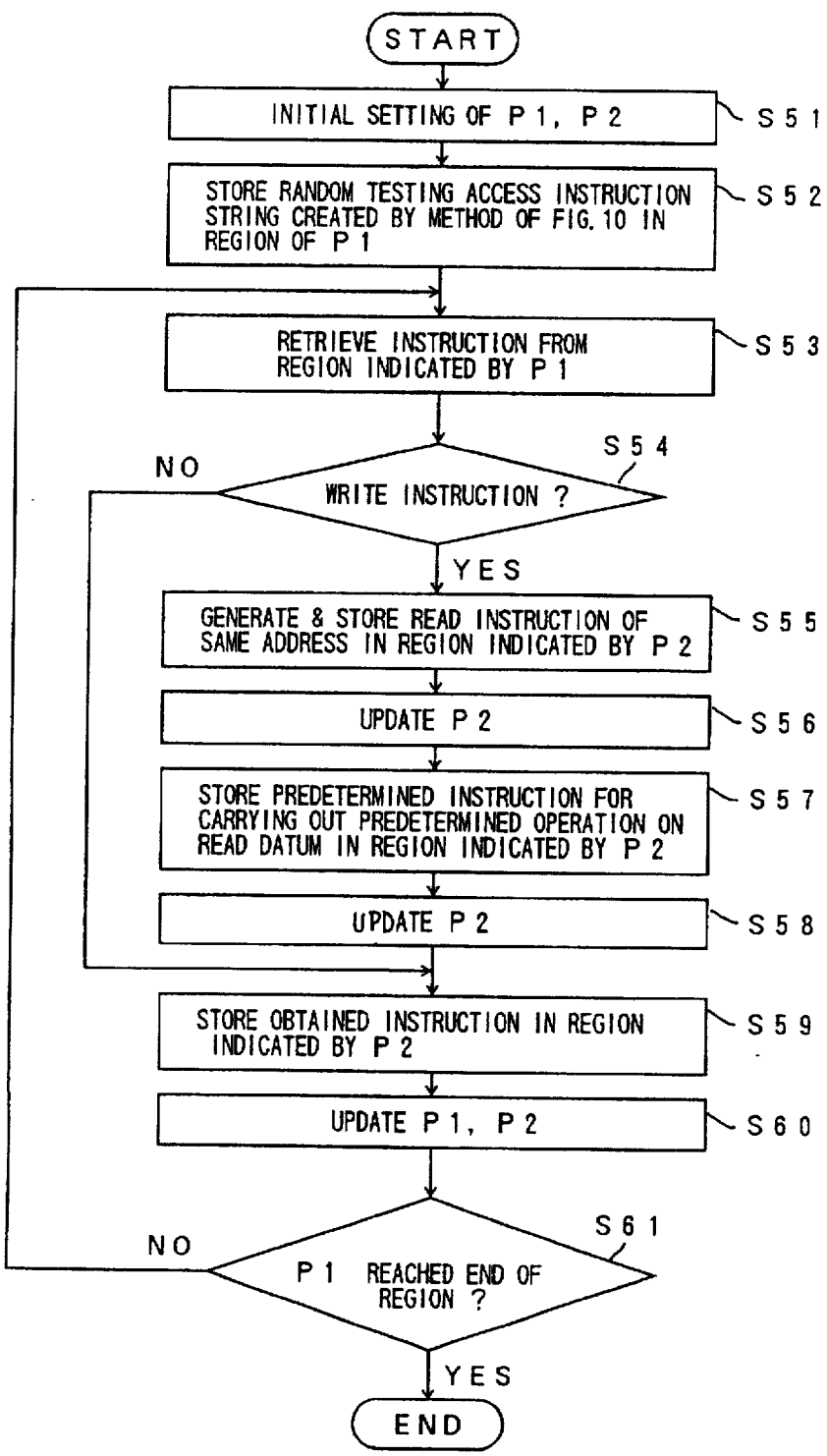
FIG. 14 is a flow chart for explaining a third embodiment of the method of creating the random access instruction string for testing.

FIG. 14 is a flow chart for explaining a third embodiment of the method of creating the random testing access instruction string, and FIG. 15 is a diagram for explaining the pointers.

In FIG. 14, a step S51 carries out an initial setting with respect to the pointers P1 and P2 shown in FIG. 15. A step S52 stores the random testing access instruction string which is created by the method described above in conjunction with FIG. 10 in a region indicated by the pointer P1. A step S53 retrieves an instruction from the region of the cache memory indicated by the pointer P1. A step S54 decides whether or not the retrieved instruction is a write instruction. The process advances to a step S59 which will be described later when the decision result in the step S54 is NO, and the process advances to a step S55 when the decision result in the step S54 is YES.

The step S55 generates a read instruction of the same address as the above write instruction, and stores the read instruction in a region of the cache memory indicated by the pointer P2. A step S56 updates the pointer P2. A step S57 stores an operation instruction which instructs a predetermined operation with respect to the read datum in the region of the cache memory indicated by the pointer P2. A step S58 updates the pointer P2. The step S59 stores the obtained instruction in the region of the cache memory indicated by the pointer P2. A step S60 updates the pointers P1 and P2, and a step S61 decides whether or not the pointer P1 reached the end of the region in which the random testing access instruction string is stored. The process returns to the step S53 when the decision result in the step S61 is NO, and the process ends when the decision result in the step S61 is YES.

Therefore, this third embodiment of the method of creating the random testing access instruction string employs a logic such that, when generating the testing access instruction string having the random sequence, the read datum is processed according to a predetermined rule. The predetermined rule in this case is an operation by a constant in accordance with the four fundamental rules of arithmetic or the like. Hence, the final result is predictable by each access source itself. This means that the final result can be compared with the predicted result at each access source.

Accordingly, there is no need to make a comparison with the final result obtained by another access source as in the case of the second embodiment of the method of creating the random testing access instruction string described above. For example, if the predetermined rule multiplies a constant K, the final result always becomes the $K^n$, where n denotes a natural number. Thus, it is possible to improve the testing accuracy in a case where the abnormality occurs in the data of the cache memory during execution of the instruction, and the testing time can also be reduced.

Figure 16:
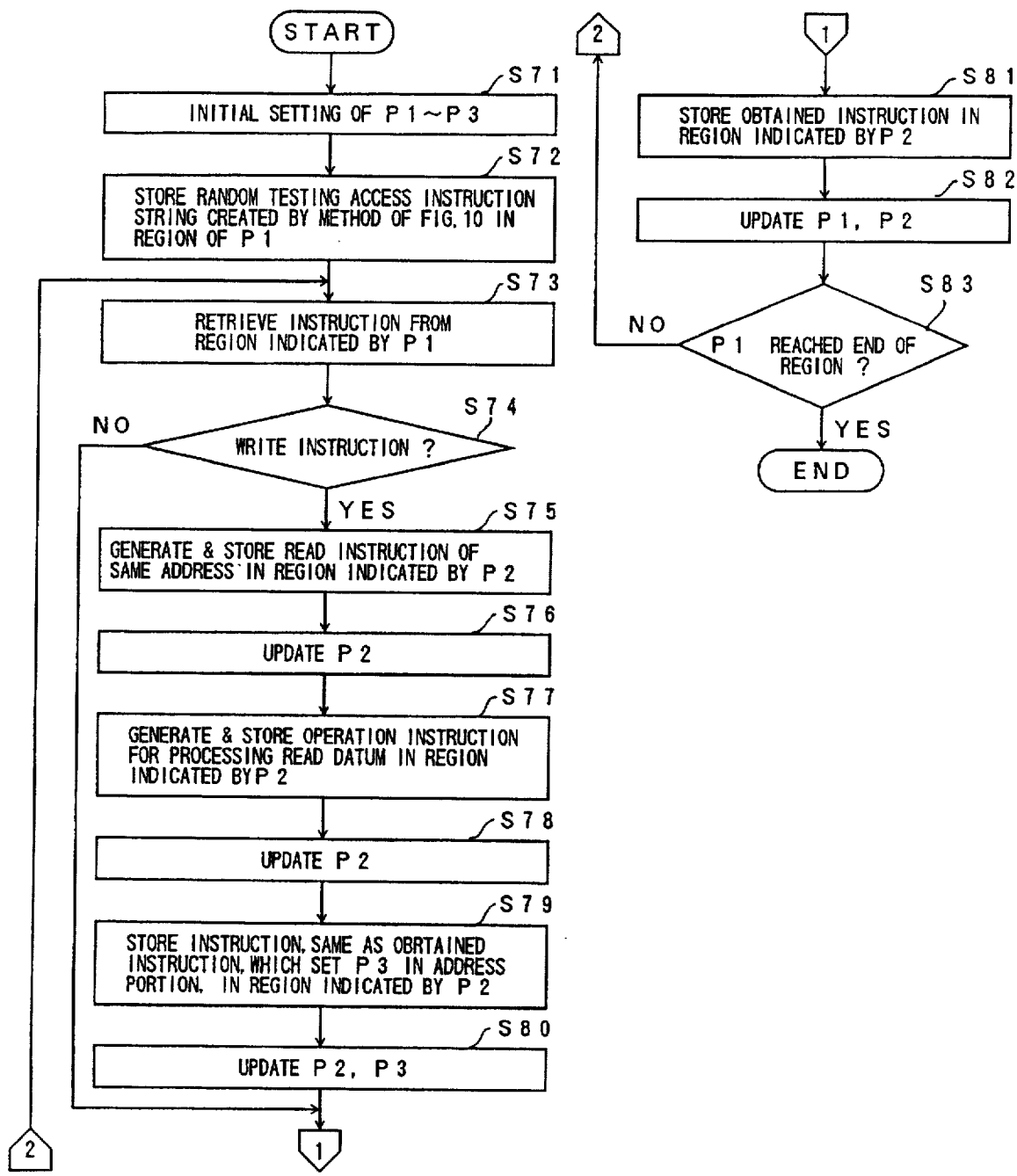
FIG. 16 is a flow chart for explaining a fourth embodiment of the method of creating the random access instruction string for testing.

FIG. 16 is a flow chart for explaining a fourth embodiment of the method of creating the random testing access instruction string, and FIG. 17 is a diagram for explaining the pointers.

In FIG. 16, a step S71 carries out an initial setting with respect to the pointers P1 through P3 shown in FIG. 17. A step S72 stores the random testing access instruction string which is created by the method described above in conjunction with FIG. 10 in a region indicated by the pointer P1. A step S73 retrieves an instruction from the region of the cache memory indicated by the pointer P1. A step S74 decides whether or not the retrieved instruction is a write instruction. The process advances to a step S81 which will be described later when the decision result in the step S74 is NO, and the process advances to a step S75 when the decision result in the step S74 is YES.

The step S75 generates a read instruction of the same address as the above write instruction, and stores the read instruction in a region of the cache memory indicated by the pointer P2. A step S76 updates the pointer P2. A step S77 generates an operation instruction which instructs a predetermined operation with respect to the read datum and stores the operation instruction in the region of the cache memory indicated by the pointer P2. A step S78 updates the pointer P2. The step S79 stores an instruction which is the same as the obtained instruction and has the pointer P3 set in the address portion in the region of the cache memory indicated by the pointer P2. A step S80 updates the pointers P1 and P2, and a step S81 stores the obtained instruction in the region of the cache memory indicated by the pointer P2. A step S82 updates the pointers P1 and P2, and a step S83 decides whether or not the pointer P1 reached the end of the region in which the random testing access instruction string is stored. The process returns to the step S73 when the decision result in the step S83 is NO, and the process ends when the decision result in the step S83 is YES.

Therefore, this fourth embodiment of the method of creating the random testing access instruction string employs a logic such that the data prior to being processed are all recorded in independent regions peculiar to each of the access sources. For this reason, when an abnormality is detected while confirming the data, it is possible to specify the instruction which is being executed out of the random testing access instruction string when the abnormality is generated by detecting a portion where the change in the recorded datum is not in accordance with a predetermined rule. Of course, it is possible to record the datum after being processed instead of recording the data prior to the processing.

Further, the present invention is not limited to these embodiments, but various variations and modifications may be made without departing from the scope of the present invention.

What is claimed is:

1. A cache memory testing method for testing a cache memory control mechanism which controls data coherency between cache memories or between a main storage unit and a cache memory in a system including N processors each having a cache memory and coupled to the main storage unit, where said processors are access sources and N is an integer greater than one, said cache memory testing method comprising the steps of:

(a) dividing a control unit depending on N, and allocating access regions within the cache memories at positions which are mutually different and are peculiar to each of the N processors in the divided portions of the control unit, said control unit being a mechanical minimum unit of the data coherency control; and (b) testing the cache memory control mechanism based on read data by writing data to and reading data from only the peculiar access regions within the same control unit by each of the N processors.

2. The cache memory testing method as claimed in claim 1, wherein said step (a) allocates an access region of M/N bytes or less with respect to each of the N processors, where M denotes a byte length of the control unit.

3. The cache memory testing method as claimed in claim 1, wherein said step (b) carries out a cache memory test without synchronizing accesses of each of the N processors.

4. The cache memory testing method as claimed in claim 2, wherein said step (b) carries out a cache memory test without synchronizing accesses of each of the N processors.

5. The cache memory testing method as claimed in claim 1, wherein said step (b) controls each of the N processors to execute a testing access instruction in a random sequence.

6. The cache memory testing method as claimed in claim 2, wherein said step (b) controls each of the N processors to execute a testing access instruction in a random sequence.

7. The cache memory testing method as claimed in claim 3, wherein said step (b) controls each of the N processors to execute a testing access instruction in a random sequence.

8. The cache memory testing method as claimed in claim 5, wherein said step (b) controls each of the N processors to execute the same access instruction string.

9. The cache memory testing method as claimed in claim 5, wherein said step (b) tests the cache memory control mechanism by:

reading, by a subsequent access instruction, a datum in an access region which is written by a preceding access instruction;

carrying out an operation process with respect to the read datum and writing the processed datum in the same access region; and comparing executed results of each of the N processors in response to an access instruction string which links the data.

10. The cache memory testing method as claimed in claim 5, wherein said step (b) tests the cache memory control mechanism by:

reading, by a subsequent access instruction, a datum in an access region which is written by a preceding access instruction;

carrying out an operation process with respect to the read datum and writing the processed datum in the same access region; and comparing an executed result and a predicted result in each of the N processors in response to an access instruction string which links the data.

11. The cache memory testing method as claimed in claim 10, wherein said step (b) records all read data or all processed data in independent regions peculiar to each of the N processors, and specifies an access instruction that is executed when an abnormality is generated out of the access instruction string by detecting a portion where a change in the recorded data is not in accordance with a predetermined rule when the abnormality is detected by confirming the data.

* * * * *